(12) United States Patent
Takenaka et al.

(10) Patent No.: US 7,348,107 B2
(45) Date of Patent: Mar. 25, 2008

(54) RETICLE, SEMICONDUCTOR EXPOSURE APPARATUS AND METHOD, AND SEMICONDUCTOR DEVICE MANUFACTURING METHOD

(75) Inventors: Tsutomu Takenaka, Utsunomiya (JP); Seiya Miura, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 728 days.

(21) Appl. No.: 10/886,767

(22) Filed: Jul. 8, 2004

(65) Prior Publication Data
US 2005/0042525 A1 Feb. 24, 2005

(30) Foreign Application Priority Data
Jul. 10, 2003 (JP) ............................. 2003-194940

(51) Int. Cl.
*G03F 1/00* (2006.01)
(52) U.S. Cl. .......................................................... 430/5
(58) Field of Classification Search .................... 430/5; 378/35
See application file for complete search history.

(56) References Cited
U.S. PATENT DOCUMENTS

| | | | |
|---|---|---|---|
| 5,422,206 A | | 6/1995 | Kamon |
| 6,627,355 B2 * | | 9/2003 | Levinson et al. ............... 430/5 |
| 2001/0028983 A1 | | 10/2001 | Kawamura et al. |
| 2002/0132171 A1 | | 9/2002 | Levinson et al. |

FOREIGN PATENT DOCUMENTS

| | | |
|---|---|---|
| JP | 8-123007 | 5/1996 |
| JP | 9-211842 | 8/1997 |
| JP | 09211842 | 8/1997 |

OTHER PUBLICATIONS

European Search Report dated Feb. 3, 2006.

\* cited by examiner

*Primary Examiner*—Stephen Rosasco
(74) *Attorney, Agent, or Firm*—Morgan & Finnegan, LLP

(57) ABSTRACT

The invention disclosed herein concerns technology that ensures, in a projection exposure process using a transmission type reticle, exposure with an even finish size throughout the entire exposure region, without adverse influence of external disturbance light such as back-surface reflection, for example. Specifically, the invention provides a reticle, a semiconductor exposure apparatus and method, and a semiconductor device manufacturing method, wherein a reticle used there includes a pattern region in which a circuit pattern is formed, a light blocking region of a width d formed at an outside periphery of the pattern region, and an anti-reflection film formed on a surface of the reticle remote from the pattern region, wherein the width d of the light blocking film satisfies a relation $$d \leq 2t \cdot \tan\left\{\sin^{-1}\left(\frac{n_1}{n_2}\sin\theta\right)\right\}$$

where n1 is a refractive index of a medium at a light entrance side of the reticle, n2 is a refractive index of the reticle, t is a thickness of the reticle, and θ is an incidence angle of light upon the reticle.

6 Claims, 7 Drawing Sheets

RETICLE, SEMICONDUCTOR EXPOSURE APPARATUS AND METHOD, AND SEMICONDUCTOR DEVICE MANUFACTURING METHOD

FIELD OF THE INVENTION AND RELATED ART

This invention relates to an exposure apparatus for use in a lithographic process to be carried out in the manufacture of semiconductor devices or liquid crystal devices, for example, or a reticle or photomask to be used in such process and having a pattern such as a circuit pattern formed thereon. In another aspect, the invention concerns an exposure method or a method of manufacturing semiconductor devices or liquid crystal devices, using such a reticle. Also, the invention is specifically directed to an original such as a reticle or photomask having a pattern such as a circuit pattern formed thereon.

Manufacture of microdevices such as semiconductor devices through a photolithography process involves use of a projection type exposure apparatus that transfers a circuit pattern or the like formed on a reticle or a photomask (hereinafter, the word "reticle" will be used to refer to both) onto a substrate such as a semiconductor wafer being coated with a photosensitive material. Because of recent needs to further miniaturization of a semiconductor device or liquid crystal device, projection optical systems should have a higher numerical aperture (NA).

In a projection type exposure apparatus using a transmission type reticle, enlargement of the NA of a projection optical system causes an increase in the angle of light incident on a reticle, and it results in an increase of reflection of light from the reticle. The reflection of light at the back surface of the reticle may cause stray light from any other element. Also, light reflected by the reticle pattern surface may be reflected again by the reticle back surface, and it may reach the wafer surface to cause growth of the linewidth in an adjacent region. Thus, the influence of reticle back-surface reflection light can not be disregarded. Here, the words "reticle back surface" refers to the surface of a reticle remote from the surface on which a circuit pattern is formed.

Figure 2A:
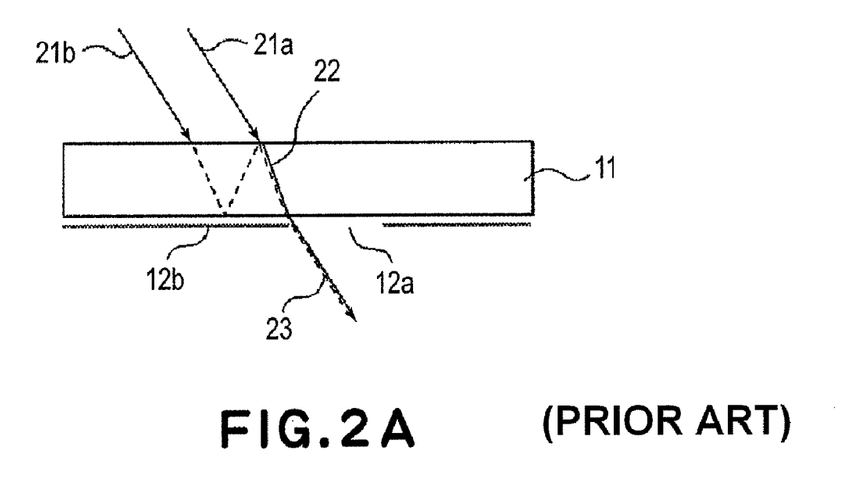
FIG. 2A shows a conventional reticle.
Figure 6:
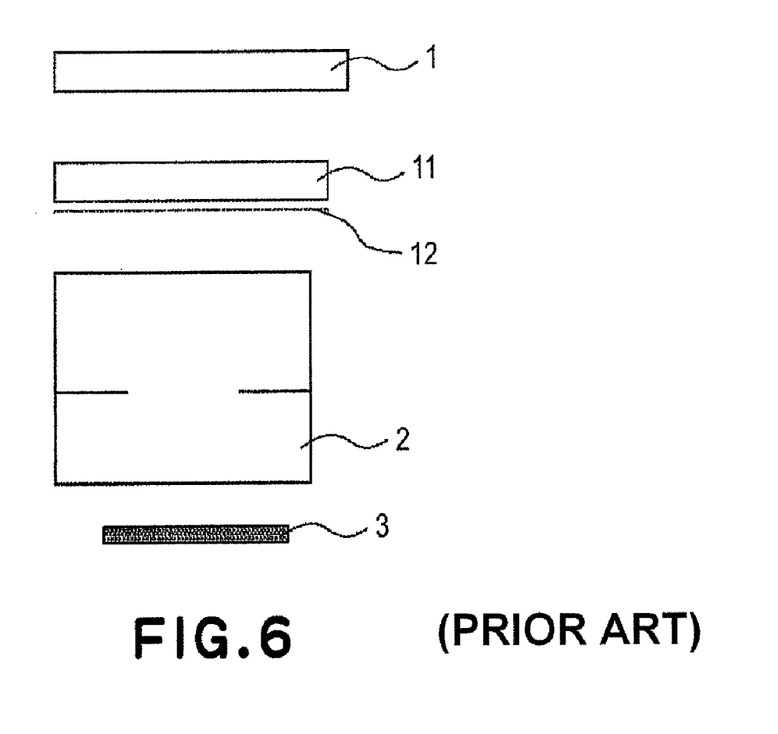
FIG. 6 is a schematic view of a conventional exposure apparatus.

The above-described phenomenon will be explained in greater detail, in conjunction with FIGS. 6 and 2A. FIG. 6 is a schematic view of a conventional-projection type exposure apparatus. Denoted in FIG. 6 at 1 is an illumination optical system for projecting light from an exposure light source to a reticle, and denoted at 11 is that reticle having a circuit pattern 12 formed thereon. Denoted at 2 is a projection optical system for projecting the circuit pattern 12 onto a wafer 3 in a reduced scale. FIG. 2A is an enlarged sectional view of a portion around the reticle 11 in FIG. 6. The circuit pattern 12 formed the reticle 11 comprises a light transmitting portion 12a and a light blocking portion 12b. Illumination light 21a from the illumination optical system 1 passes through the light transmitting portion 12a formed on the pattern surface 12, and it is projected onto the wafer surface as exposure light through the projection optical system 2. On the other hand, illumination light 21b similarly provided from the illumination optical system is blocked by the light blocking portion 12b defined on the pattern surface 12. Here, a portion of the illumination light 21b may be reflected by the light blocking portion 12b and it may be again reflected by the reticle back surface 15 to produce light 23 passing through the light transmitting portion 12a and entering the projection optical system 2. In that occasion, the light 23 is stray light which adversely causes growth of the linewidth in an adjacent portion of the pattern transfer region on the wafer, or degradation of the image performance.

Generally, a reticle is formed with a light blocking zone of about 1.5 mm width which is defined at an outside periphery of a region where a circuit pattern is formed. This zone is provided to prevent impingement of exposure light to the outside periphery of the circuit pattern region, upon the wafer, even if the illumination region on the reticle to be illuminated by the illumination optical system 1 deviates slightly from the region where the circuit pattern is formed. However, due to the increasing NA of exposure apparatuses, there is a high possibility that reflection light from a region of the reticle where a circuit pattern is formed goes beyond the light blocking zone of the reticle because of reflection at the reticle back surface 15, and it leaks outwardly of the region where the circuit pattern is formed. This means that an area not included in the exposure region is exposed thereby. Thus, in an exposure method such as a step-and-repeat method or step-and-scan method wherein a pattern is transferred successively to different shots, an adjoining shot is adversely affected. Therefore, it is desirable to avoid reflection light from the reticle back surface.

Japanese Laid-Open Patent Applications, Publication Nos. 08-123007 and 09-211842 disclose use of an anti-reflection film applied to a reticle.

In Japanese Laid-Open Patent Application, Publication No. 08-123007, reticle alignment is performed for a reticle having a half tone film and, since the intensity of alignment reflection light becomes smaller, anti-reflection treatment is carried out to an alignment mark so as to reduce external disturbance light by the glass surface reflection.

Japanese Laid-Open Patent Application, Publication No. 09-211842 shows provision of a fine surface-irregularity shape upon the surface of a mask or of an optical system of an exposure apparatus, so as to increase the transmission efficiency of exposure light.

SUMMARY OF THE INVENTION

It is an object of the present invention to assure exposure with an even finish size throughout the entire exposure region, without an influence of external disturbance light such as back-surface reflection, in a process of projection exposure using a transmission type reticle.

It is another object of the present invention to provide an exposure method which can accomplish best exposure using a mask or reticle, in accordance with an exposure condition to be used in different processes where the linewidth to be exposed is different.

In accordance with an aspect of the present invention, there is provided a reticle, comprising: a pattern region in which a circuit pattern is formed; a light blocking region of a width d formed at an outside periphery of the pattern region; and an anti-reflection film formed on a surface of the reticle remote from the pattern region, wherein the width d of the light blocking film satisfies a relation $$d \le 2t \cdot \tan\left\{\sin^{-1}\left(\frac{n_1}{n_2}\sin\theta\right)\right\}$$

where n1 is a refractive index of a medium at a light entrance side of the reticle, n2 is a refractive index of the reticle, t is a thickness of the reticle, and θ is an incidence angle of light upon the reticle.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIGS. 2A and 2B illustrate reflection light at a portion around a reticle, wherein

DESCRIPTION OF THE PREFERRED EMBODIMENTS

Preferred embodiments of the present invention will now be described with reference to the attached drawings. In the drawings, like numerals are assigned to corresponding elements, and duplicate description are omitted.

Figure 1:
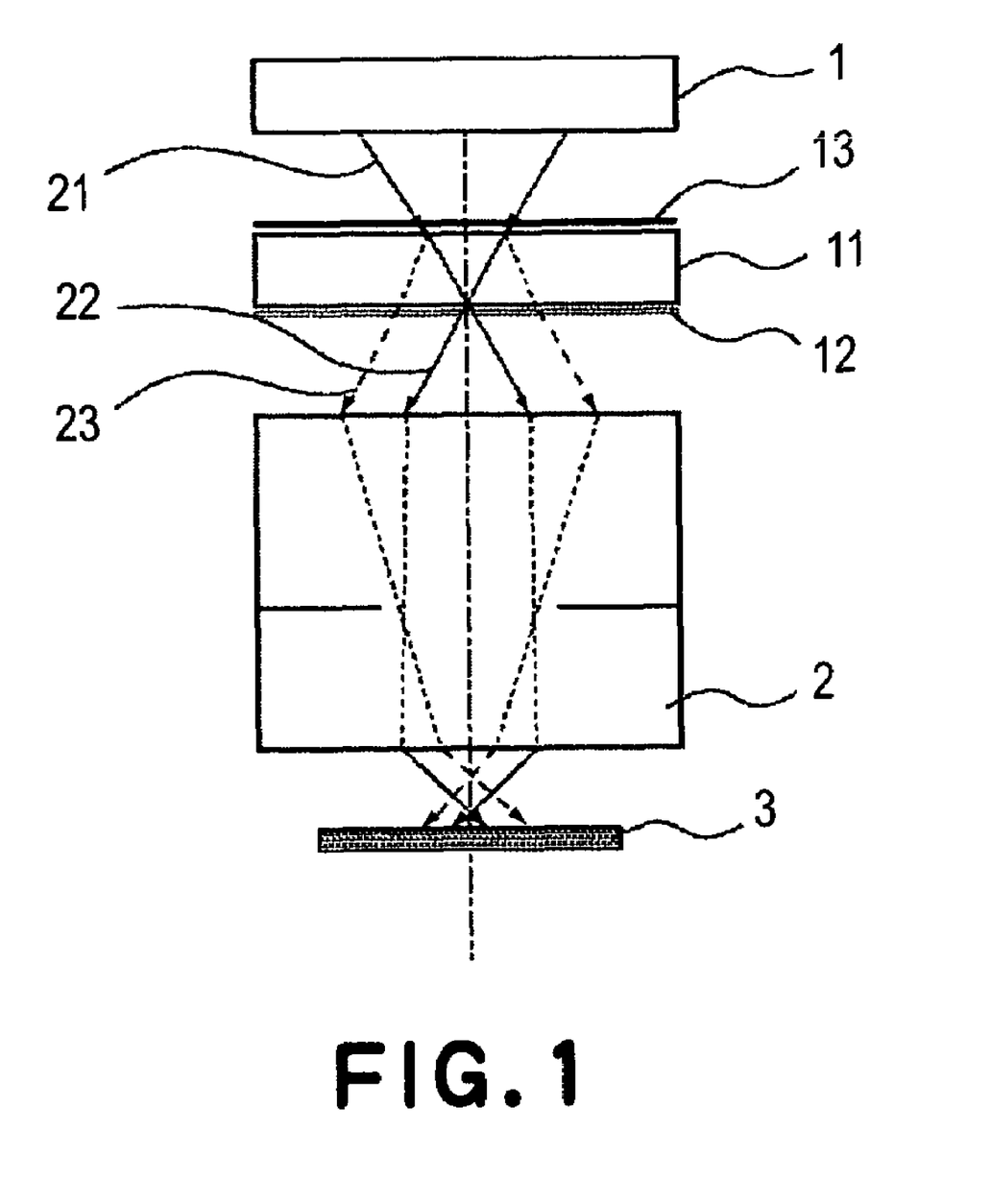
FIG. 1 is a schematic view of an embodiment wherein the present invention is applied to a reduction projection exposure apparatus.
Figure 2B:
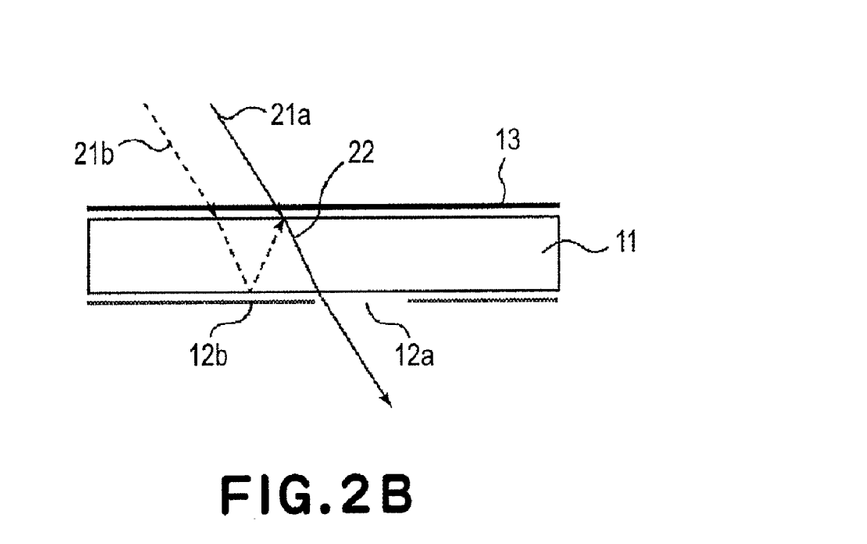
FIG. 2B shows a reticle according to an embodiment of the present invention, having an anti-reflection film.
Figure 3:
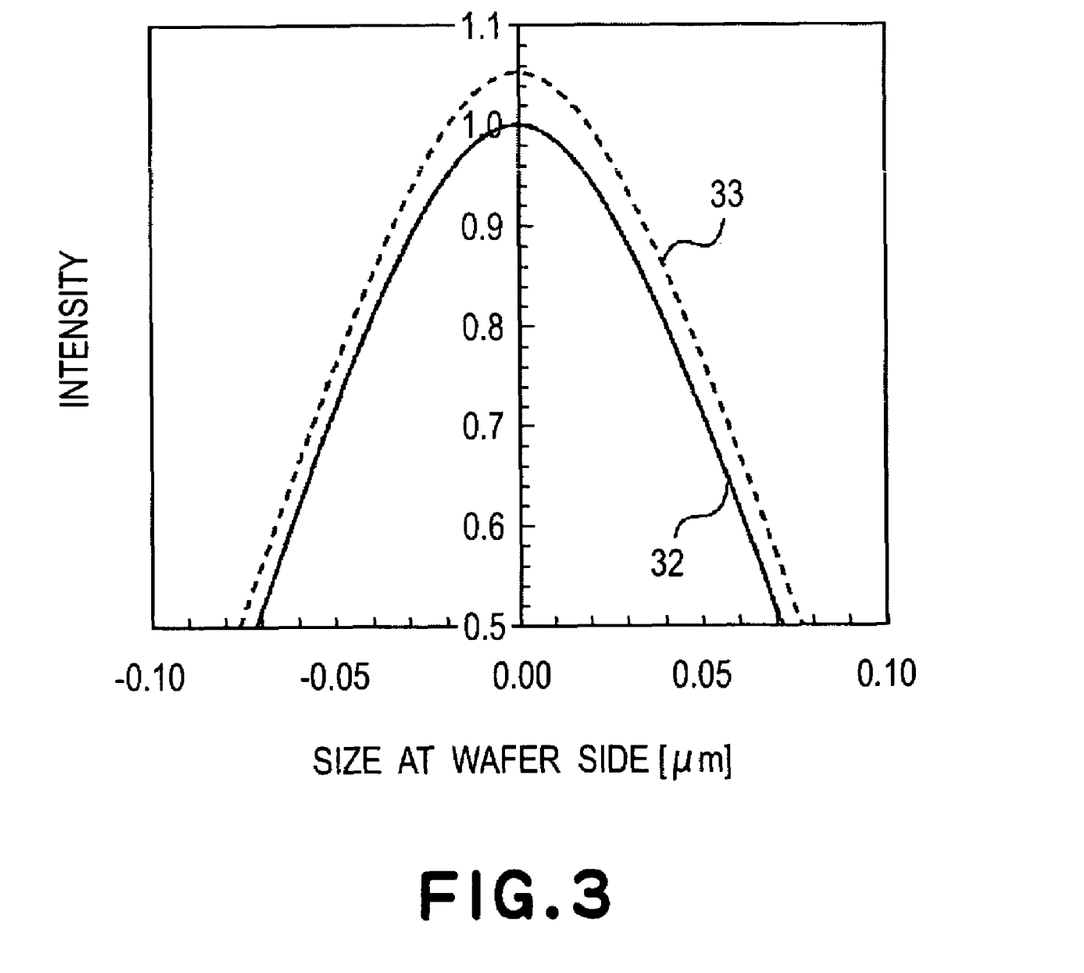
FIG. 3 is a graph for explaining changes in a light intensity distribution upon a wafer surface, due to reflection light.
Figure 4:
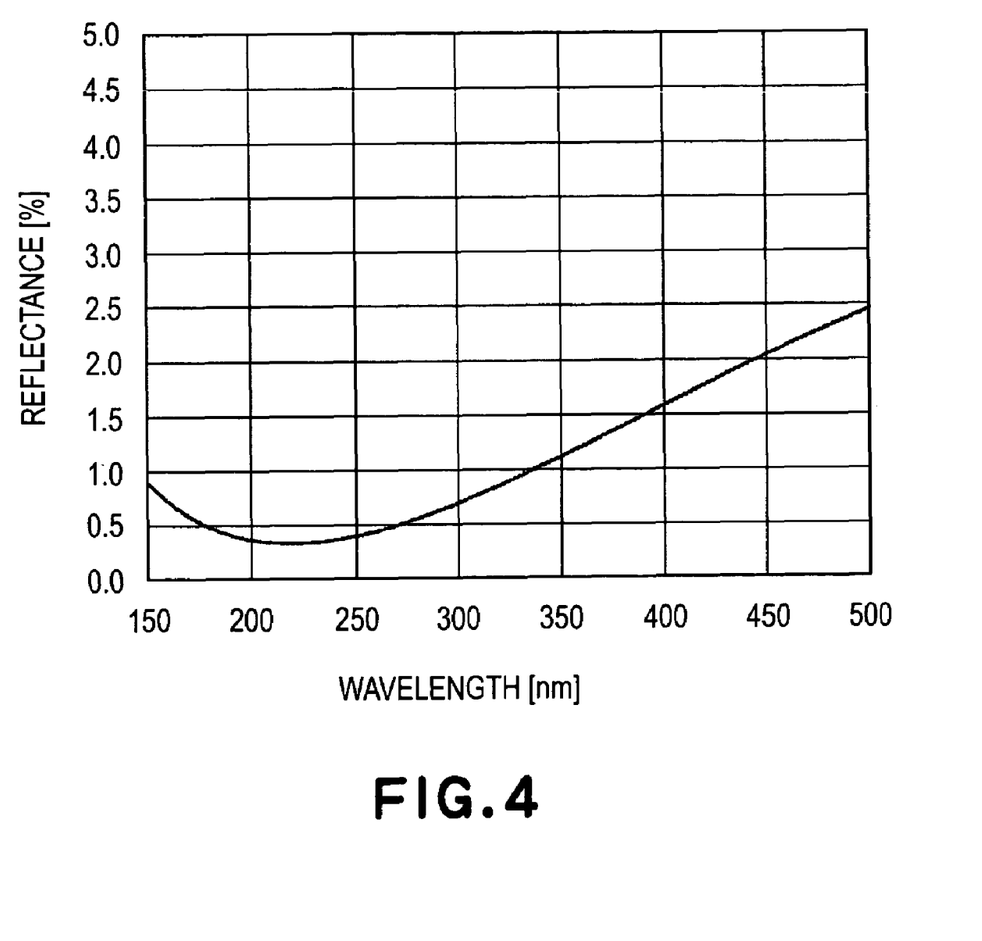
FIG. 4 is a graph for explaining reflectance characteristic of a monolayer anti-reflection film.
Figure 5:
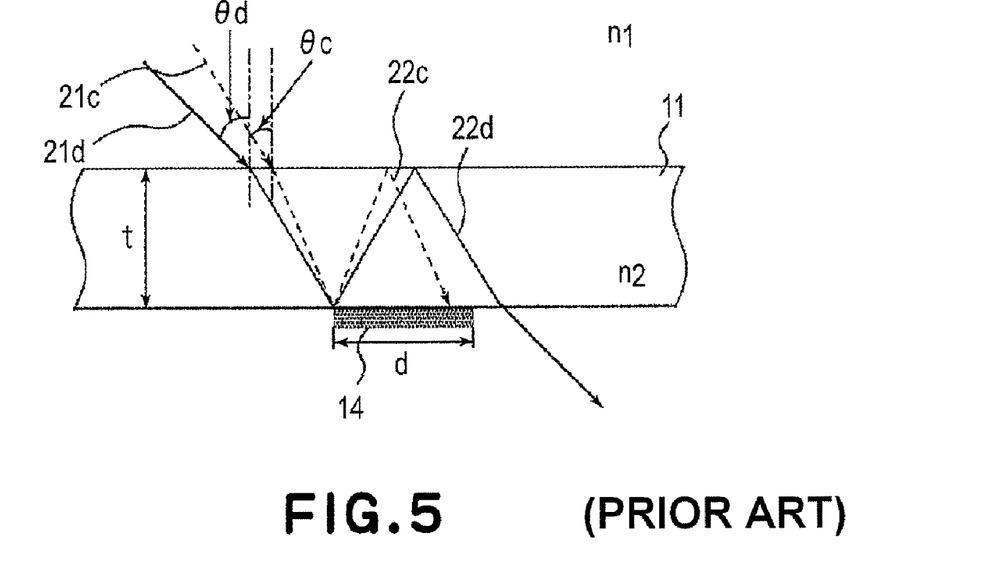
FIG. 5 is a schematic view for explaining the possibility of irradiation of a region outside a device region, with reflection light.

Referring to FIGS. 1-5, a transmission type reticle according to an embodiment of the present invention will be described. FIG. 1 is a schematic view of an example wherein the present invention is applied to a reduction projection exposure apparatus. FIGS. 2A and 2B illustrate reflection light inside a reticle. FIG. 3 shows changes in the light intensity distribution upon a wafer surface, due to reflection light. FIG. 4 shows reflectance characteristic of a monolayer anti-reflection film, and FIG. 5 is a schematic view for explaining irradiation of a region outside a device region, with reflection light.

In FIG. 5, denoted at 1 is an illumination optical system for projecting light from a light source, onto a reticle. Denoted at 11 is that reticle having a circuit pattern 12 formed thereon. Denoted at 2 is a projection optical system for projecting the circuit pattern 12 onto a wafer 3, in a reduced scale. In this embodiment, illumination light 21 projected from the illumination system 1 is incident on the transmission type reticle 11, such that the pattern 12 formed in a pattern region of the reticle is transferred to the wafer 3 through the projection optical system 2 and with exposure light 22 (see FIG. 1). In accordance with a step-and-repeat method or step-and-scan method, the pattern is transferred to different shots of the wafer successively.

In accordance with this embodiment, an anti-reflection film 13 is provided at the back surface of the reticle 11, that is, on the surface remote from the reticle 11 surface where the circuit pattern 12 is formed (see FIG. 2B). Illumination light 12a incident on the reticle passes through the light transmitting portion 12a formed on the reticle pattern surface 12, and it is projected on the wafer surface as exposure light 22. On the other hand, illumination light 21b incident on the reticle is intercepted by a light blocking portion 12b. A portion of the illumination light 12b is then reflected and it reaches the reticle back surface. Since however there is an anti-reflection film 13 provided at the reticle back surface, almost no light of illumination light 21b is reflected by the reticle back surface. Thus, there is substantially no possibility that the illumination light 21b passes the transmitting portion 12a and impinges on the wafer 3 through the projection optical system 2. Namely, creation of stray light can be avoided.

The effect of such anti-reflection film 13 will be explained in terms of Gaussian intensity distribution (FIG. 3). The curve denoted in FIG. 3 at 32 is an intensity distribution of exposure light to be defined on a wafer 3 when fine lines are to be produced on the wafer. In this case, if it is assumed that the finish linewidth after exposure and development is determined with a certain slice level (which is determined by exposure amount or resist sensitivity) and that the slice level is 50% of the peak intensity, a finish linewidth of about 140 nm is obtainable.

On the other hand, the curve denoted at 33 is an intensity distribution in a case where there is stray light of 5% to light 22. If the width of the curve at the slice level (exposure amount) 50%, as determined by the region where flare is small, is the region to be patterned by the exposure, the exposure linewidth of the curve 32 becomes larger by about 7.5% as compared with the curve 32. Namely, it is seen that, as compared with a case wherein the exposure amount is determined on the basis of a region having small stray light, the linewidth in the region having stray light grows by about 1.5% per 1% of stray light. This means that the linewidth becomes larger by 1.5% from what has been aimed at.

FIG. 4 shows the reflectance characteristic as calculated when an anti-reflection film of monolayer type, for example, is provided on the back surface of the reticle. According to this reflectance characteristic, if exposure light having a wavelength 248 nm, for example, is used, the reflectance can be suppressed to 0.5% or less. Taking into account that the reflectance in a case where light is perpendicularly incident on a glass surface without an anti-reflection film is about 4%, creation of stray light can be reduced to ⅛ or lower. Thus, a distribution of exposure light near the idealistic intensity distribution 32 can be produced on the wafer, and a correct linewidth can be formed by exposure.

The anti-reflection film is not limited to a monolayer film. A multilayered film, for example, may be used, and the reflectance can be lowered more in that occasion. The advantageous effects as described above can be extended.

Further, while the exposure wavelength is 248 nm in the above-described example, a different wavelength such as 157 nm or 134 nm may be used.

This embodiment is effective also in regard to a case wherein reflection light at a light blocking portion provided at the outer periphery of a device region of a reticle, where a circuit pattern is formed, produces an adverse influence to a region outside the device region. This will be explained below, in conjunction with FIG. 5.

Usually, while taking into account the light shielding of an illumination region, a reticle is provided with a light blocking zone 14 at the outer periphery of the reticle pattern region. The width thereof is 1.5 mm, for example. Where the NA is small (NA=sin θc), illumination light 21c enters from the device region (the region of the reticle at the left-hand side of the light blocking zone 14 as viewed in the drawing). Illumination light 22c as reflected by the light blocking zone is again reflected by the reticle back surface and, again, it is blocked by the light blocking zone. Thus, it does not go out to the wafer side, as stray light.

The illumination light as reflected plural times between the light blocking zone 14 and the reticle back surface may advance toward the wafer side. In such case, however, it would be easily expected that the intensity is very low so that it does not have an influence to the exposure. If, on the other hand, the NA is large (NA=sin θd) and illumination light 21d incident from the device region is reflected twice by the light blocking zone and the reticle bask surface, the light may goes beyond the width of the light blocking zone and it may leaks toward the outside of the device region, as shown at 22d. Namely, this means that an area not included in the exposure region is exposed thereby. Since this applies an adversely influence to an adjacent shot region, reflection light from the reticle back surface as described above should be avoided.

It may be possible to make the light blocking zone larger as the exposure NA becomes large. However, usually, at an area on the reticle which is outside the device region, namely, outside the light blocking zone, there are marks provided for alignment operation. If the light blocking zone becomes larger, these alignment marks have to be placed outwardly. Since the alignment marks should be projected onto a wafer through a projection optical system, this necessitates enlargement of the effective region of the projection optical system. However, because it requires extension of the performance assured region of the projection optical system, production difficulties are much raised on one hand and the size is enlarged on the other hand. In consideration of this, the light blocking region should be kept small.

Now, the relationship between the range of influence of reflection light due to enlargement of the NA and the width of the light blocking zone, will be considered. If the refractive index of a medium before incidence of light upon the reticle is n1, the refractive index of the reticle is n2, the thickness of the reticle is t, the width of the light blocking zone is d, and the incidence angle of light is θ (it is θc if NA is low, and θd if NA is high), the condition for that the light goes beyond the width of the light blocking zone and leaks to the outside of the device region can be given by:

$$d \leq 2t \cdot \tan\left\{\sin^{-1}\left(\frac{n_1}{n_2}\sin\theta\right)\right\}$$

If, for example, numerical condition that n1=1.0, n2=1.5, t=6.35 mm, and d=15 mm are applied as the conditions in an ordinary exposure apparatus, the NA (sin θ) must be not less than about 0.175 upon the reticle, otherwise it couldn't be set up. Thus, the present invention can be effectively applied to a case where the NA is not less than 0.175.

The conditions described above are a mere example, and the invention is not limited to them. Furthermore, not only they can be used for calculation of the NA but also they can be used for calculation of d or t for a certain NA.

If the projection magnification (reduction ratio) for transferring a pattern of a reticle onto a wafer is 4×, the numerical aperture 0.175 or more upon the reticle means that the numerical aperture on the wafer is 0.7 or more. Of course, if the projection magnification is different, the NA on the wafer becomes different.

Furthermore, this embodiment can provide a larger technical advantage with higher reflectance from the reticle pattern surface is. Generally, a dual-layer coated reticle has a higher reflectance than a triple-layer coated reticle. An example is that, with respect to an exposure wavelength of 248 nm, the reflectance of a pattern surface of a triple-layer coated reticle may be about 5%, whereas the reflectance of a pattern surface of a dual-layer coated reticle may be about 35%. Although the numerical values of the reflectance are not limited to this example, it is well known that there would be produced a large difference in reflectance. Thus, it can be said that the present invention provides a larger advantageous effect with a dual-layer coated reticle.

The semiconductor exposure process includes a variety of processes such as from a process for performing a fine exposure to a process for performing exposure of a relatively rough linewidth. Thus, production of reticles may be carried out appropriately selectively. That is, the anti-reflection treatment may be carried out to those reticles to be used in such exposure process that should satisfy the conditions described above, whereas the anti-reflection treatment may be omitted for those reticles to be used in a process of relatively rough linewidth, that is, a process with relatively small NA. In this manner, the production cost can be minimized, and yet a uniform and satisfactory fine-exposure operation is assured.

Embodiment of Device Manufacturing Method

Next, referring to FIGS. 7 and 8, an embodiment of a device manufacturing method which uses a projection exposure apparatus such as shown in FIG. 1, will be explained.

Figure 7:
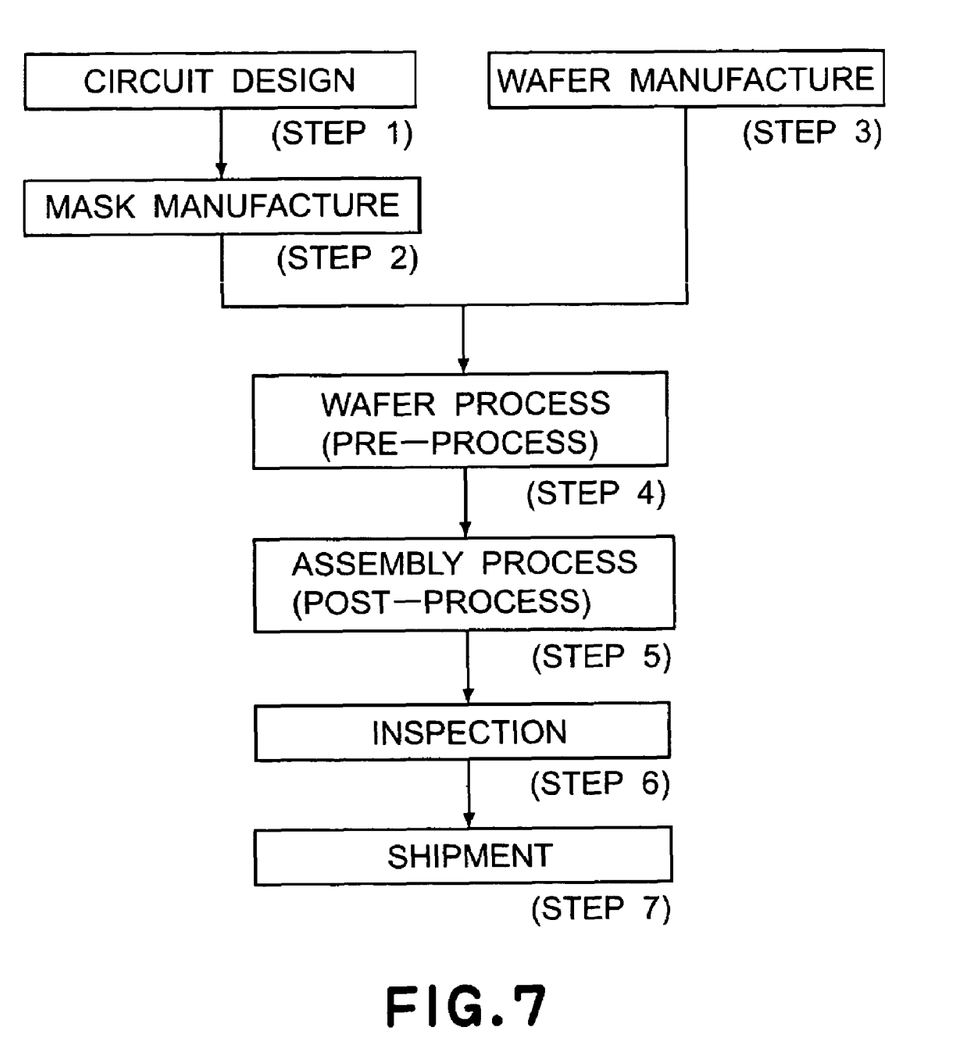
FIG. 7 is a flow chart of device manufacturing processes.

FIG. 7 is a flow chart for explaining the procedure of manufacturing various microdevices such as semiconductor chips (e.g., ICs or LSIs), liquid crystal panels, CCDs, thin film magnetic heads or micro-machines, for example. Step 1 is a design process for designing a circuit of a semiconductor device. Step 2 is a process for making a mask on the basis of the circuit pattern design. Step 3 is a process for preparing a wafer by using a material such as silicon. Step 4 is a wafer process which is called a pre-process wherein, by using the thus prepared mask and wafer, a circuit is formed on the wafer in practice, in accordance with lithography. Step 5 subsequent to this is an assembling step which is called a post-process wherein the wafer having been processed at step 4 is formed into semiconductor chips. This step includes an assembling (dicing and bonding) process and a packaging (chip sealing) process. Step 6 is an inspection step wherein an operation check, a durability check an so on, for the semiconductor devices produced by step 5, are carried out. With these processes, semiconductor devices are produced, and they are shipped (step 7).

Figure 8:
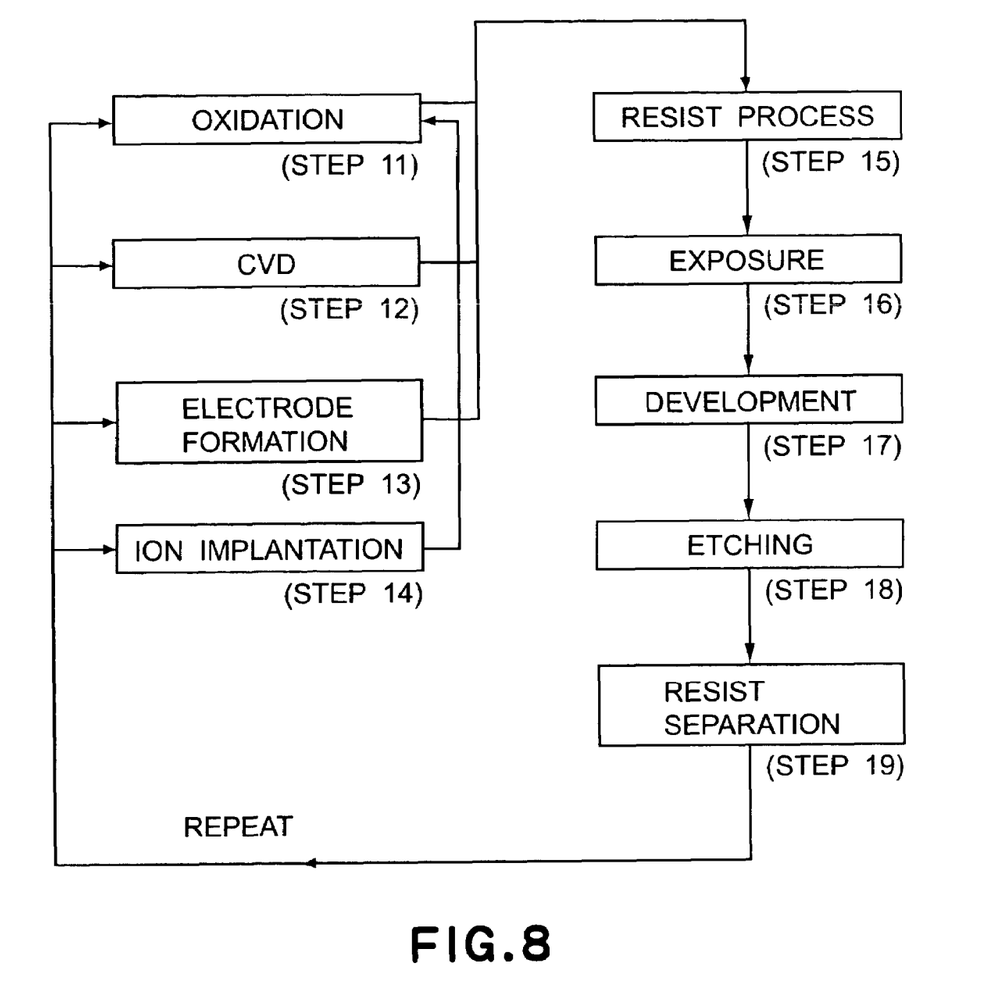
FIG. 8 is a flow chart for explaining details of a wafer process in the procedure of FIG. 7.

FIG. 8 is a flow chart for explaining details of the wafer process. Step 11 is an oxidation process for oxidizing the surface of a wafer. Step 12 is a CVD process for forming an insulating film on the wafer surface. Step 13 is an electrode forming process for forming electrodes upon the wafer by vapor deposition. Step 14 is an ion implanting process for implanting ions to the wafer. Step 15 is a resist process for applying a resist (photosensitive material) to the wafer. Step 16 is an exposure process for printing, by exposure, the circuit pattern of the mask on the wafer through the exposure apparatus described above. Step 17 is a developing process for developing the exposed wafer. Step 18 is an etching process for removing portions other than the developed resist image. Step 19 is a resist separation process for separating the resist material remaining on the wafer after being subjected to the etching process. By repeating these processes, circuit patterns are superposedly formed on the wafer.

With these processes, high density microdevices can be manufactured.

With the provision of an anti-reflection film at the back surface of a reticle, according to the present invention, the influence of reflection light can be reduced significantly. This effectively avoids creation of stray light from any other element, or prevents light reflected by the pattern surface from being reflected by a glass surface and from impinging on a wafer surface to cause a non-uniform linewidth in an adjacent region. Furthermore, unwanted reflection, inside the reticle, of illumination light from a device region and resultant illumination of a non-exposure region with such light, can be avoided effectively.

Particularly, if a light blocking zone is provided outside the pattern region and alignment marks should be placed outside the light blocking zone, the arrangement of the present invention effectively assures uniform and fine exposure without enlargement of the size of the apparatus or an increase of the cost.

While the invention has been described with reference to the structures disclosed herein, it is not confined to the details set forth and this application is intended to cover such modifications or changes as may come within the purposes of the improvements or the scope of the following claims.

This application claims priority from Japanese Patent Application No. 2003-194940 filed Jul. 10, 2003, for which is hereby incorporated by reference.

What is claimed is:

1. A reticle, comprising:
a circuit pattern;
an alignment mark;
a light blocking region of a width d formed between the circuit pattern and the alignment mark and around an outside periphery of the circuit pattern,
wherein the width d of the light blocking film satisfies a relation $$d \le 2t \cdot \tan\left\{\sin^{-1}\left(\frac{n_1}{n_2}\sin\theta\right)\right\}$$

where n1 is a refractive index of a medium at a light entrance side of the reticle, n2 is a refractive index of the reticle, t is a thickness of the reticle, and θ is an incidence angle of light upon the reticle; and
an anti-reflection film formed on a back face of the reticle remote from a front face of the reticle where the circuit pattern, the light blocking region and the alignment mark are formed.

2. A reticle according to claim 1, wherein the anti-reflection film comprises a multilayered film.

3. A reticle according to claim 1, wherein a numerical aperture of light incident on the reticle is not less than 0.175.

4. A reticle according to claim 1, wherein the circuit pattern has a dual-layer structure.

5. An exposure method for exposing a substrate with a pattern of a reticle, said method comprising the steps of:
loading the reticle into an exposure apparatus;
loading a substrate into the exposure apparatus; and transferring the pattern of the reticle onto the substrate by use of exposure light,
wherein the reticle comprises (i) a pattern region in which a circuit pattern is formed, (ii) a light blocking region of a width d formed between the circuit pattern and the alignment mark and around an outside periphery of the circuit pattern, and (iii) an anti-reflection film formed on a back face of the reticle remote from a front face of the reticle where the circuit pattern, the light blocking region and the alignment mark are formed, wherein the width d of the light blocking film satisfies a relation $$d \le 2t \cdot \tan\left\{\sin^{-1}\left(\frac{n_1}{n_2}\sin\theta\right)\right\}$$

where n1 is a refractive index of a medium at a light entrance side of the reticle, n2 is a refractive index of the reticle, t is a thickness of the reticle, and θ is an incidence angle of light upon the reticle.

6. A device manufacturing method, comprising the steps of:
exposing a substrate with a circuit pattern formed on a reticle;
and developing the exposed substrate, wherein the reticle comprises (i) a pattern region in which a circuit pattern is formed, (ii) a light blocking region of a width d formed between the circuit pattern and the alignment mark and around an outside periphery of the circuit pattern, and (iii) an anti-reflection film formed on a back face of the reticle remote from a front face of the reticle where the circuit pattern, the light blocking region and the alignment mark are formed,
wherein the width d of the light blocking film satisfies a relation $$d \le 2t \cdot \tan\left\{\sin^{-1}\left(\frac{n_1}{n_2}\sin\theta\right)\right\}$$

where n1 is a refractive index of a medium at a light entrance side of the reticle, n2 is a refractive index of the reticle, t is a thickness of the reticle, and θ is an incidence angle of light upon the reticle.

* * * * *